(12) United States Patent
Higuchi (10) Patent No.: US 10,643,799 B2
(45) Date of Patent: May 5, 2020

(54) SOLAR CELL MODULE INCLUDING SUBSTRATE, ELEMENT SECTION, SEALER, AND FIRST MATERIAL

(71) Applicant: Panasonic Corporation, Osaka (JP)

(72) Inventor: Hiroshi Higuchi, Kyoto (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 16/024,800

(22) Filed: Jun. 30, 2018

(65) Prior Publication Data
US 2019/0019628 A1    Jan. 17, 2019

(30) Foreign Application Priority Data

Jul. 11, 2017    (JP) .................... 2017-135360

(51) Int. Cl.
*H01G 9/20*    (2006.01)
*H01L 51/44*    (2006.01)
(Continued)

(52) U.S. Cl.
CPC ......... *H01G 9/2077* (2013.01); *H01G 9/2009* (2013.01); *H01L 27/301* (2013.01);
(Continued)

(58) Field of Classification Search
None
See application file for complete search history.

(56) References Cited

U.S. PATENT DOCUMENTS

2015/0200377 A1* 7/2015 Etgar .................... H01L 51/005
                                                    136/256
2016/0276413 A1  9/2016 Iida et al.
2017/0149005 A1  5/2017 Suzuka et al.

FOREIGN PATENT DOCUMENTS

EP    2752883      7/2014
JP    2013-042007  2/2013
(Continued)

OTHER PUBLICATIONS

Ng et al., "Efficiency enhancement by defect engineering in perovskite photovoltaic cells prepared using evaporated PbI2/CH3NH3I multilayers", J. Mater. Chem. A, 2015, 3, 9223-9231 (Year: 2015).*
(Continued)

*Primary Examiner* — Tamir Ayad
(74) *Attorney, Agent, or Firm* — Renner, Otto, Boisselle & Sklar, LLP (57) ABSTRACT

A solar cell module includes a substrate, an element section disposed on the substrate and including a unit cell, a sealer, and a first material. The element section and the first material are housed in a space sealed with the sealer. The unit cell includes a pair of electrodes having conductivity and includes a light-absorbing layer located between the pair of electrodes and converting light into electric charge. The light-absorbing layer includes a perovskite compound represented by a compositional formula $AMX_3$, where A represents a monovalent cation, M represents a divalent cation, and X represents a monovalent anion. The first material is an amine derivative represented by a compositional formula $(Q_1Q_2Q_3\text{-N---H})Y$, where $Q_1$, $Q_2$, and $Q_3$ each independently represent a functional group including at least one element selected from the group consisting of carbon, hydrogen, nitrogen, and oxygen; and Y represents a halogen.

10 Claims, 4 Drawing Sheets

(51) Int. Cl.
  *H01L 27/30* (2006.01)
  *H01L 51/42* (2006.01)
  *H01L 51/00* (2006.01)
  *H01L 31/0256* (2006.01)

(52) U.S. Cl.
  CPC ........ *H01L 51/4226* (2013.01); *H01L 51/448* (2013.01); *H01G 9/2036* (2013.01); *H01L 51/004* (2013.01); *H01L 51/006* (2013.01); *H01L 51/0035* (2013.01); *H01L 51/0043* (2013.01); *H01L 51/0056* (2013.01); *H01L 51/0077* (2013.01); *H01L 2031/0344* (2013.01)

(56) References Cited

FOREIGN PATENT DOCUMENTS

| JP | 2014-229747 | 12/2014 |
| JP | 2016-092293 | 5/2016 |
| JP | 2016-178187 | 10/2016 |
| JP | 2017-103450 | 6/2017 |
| WO | 2013/031978 | 3/2013 |

OTHER PUBLICATIONS

Son, Dae-Yong et al., "Self-formed grain boundary healing layer for highly efficient CH3NH3PbI3 perovskite solar cells", Nature Energy, Jun. 20, 2016, No. 16081, DOI: 10.1038, vol. 1, Jul. 2016. (Year: 2016).*

Hawash, Zafer et al., "Interfacial Modification of Perovskite Solar Cells Using an Ultrathin MAI layer Leads to Enhanced Energy Level Alignment, Efficiencies, and Reproducibility", Journal of Physical Chemistry Letters, Aug. 2, 2017, 8, pp. 3947-3953. (Year: 2017).*

Dao, Quang-Duy et al., "Study on degradation mechanism of perovskite solar cell and their recovering effects by introducing CH3NH3I layers", Organic Electronics 43, 2017, pp. 229-234. (Year: 2017).*

\* cited by examiner

SOLAR CELL MODULE INCLUDING SUBSTRATE, ELEMENT SECTION, SEALER, AND FIRST MATERIAL

BACKGROUND

1. Technical Field

The present disclosure relates to a solar cell module.

2. Description of the Related Art

In recent years, solar cells including a compound having a perovskite crystal structure represented by $AMX_3$ or its similar crystal structure (hereinafter, referred to as "perovskite compound") as a light-absorbing material are being researched and developed. In the present specification, a solar cell including a perovskite compound is called a "perovskite solar cell".

The perovskite solar cell is disclosed in, for example, Japanese Unexamined Patent Application Publication No. 2016-092293.

International Publication No. WO2013/031978 discloses a solar cell module including a plurality of perovskite solar cells connected in series on a substrate.

SUMMARY

In one general aspect, the techniques disclosed here feature a solar cell module comprising a substrate, an element section disposed on the substrate and including a unit cell, a sealer, and a first material. The element section and the first material are housed in a space sealed with the sealer. The unit cell includes a pair of electrodes having conductivity and includes a light-absorbing layer, the light-absorbing layer being located between the pair of electrodes and converting light into electric charge. The light-absorbing layer includes a perovskite compound represented by a compositional formula $AMX_3$, where A represents a monovalent cation; M represents a divalent cation; and X represents a monovalent anion. The first material is an amine derivative represented by a compositional formula $(Q_1Q_2Q_3\text{-N—H})Y$, where $Q_1$, $Q_2$, and $Q_3$ each independently represent a functional group including at least one element selected from the group consisting of carbon, hydrogen, nitrogen, and oxygen; and Y represents a halogen.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Underlying knowledge forming basis of the present disclosure is as follows.

The investigation by the present inventor revealed that in known solar cell modules including perovskite solar cells, the performance of the perovskite solar cells is decreased by operation for a long time or storage for a long time in a light irradiation environment. This is probably caused by that the perovskite compound $AMX_3(A^+B^{2+}X^-_3)$ is decomposed by an increase in temperature or irradiation with light. When A represents an amine derivative hydride, the decomposition of $AMX_3$ releases a halogen salt AX as a gas as shown in Expression (1). Consequently, the perovskite compound serving as a light-absorbing material decreases, and it is inferred that the battery performance is decreased. The halogen salt AX is an amine derivative hydrohalogenic acid salt.

$$ABX_3 \Leftrightarrow AX + BX_2 \tag{1}$$

In contrast to this, the present inventor found the followings. The equilibrium of the decomposition reaction shown in Expression (1) can be shifted to the left direction by sealing the perovskite solar cell and previously disposing an amine derivative hydrohalogenic acid salt, such as AX, in the sealed space. As a result, the perovskite compound can be prevented from being decomposed. The material filling the sealed space may be any material that can shift the equilibrium of Expression (1) to the left direction. For example, the material may be an amine derivative different from AX released from the perovskite compound by decomposition.

An embodiment of the present disclosure is based on the above-described findings and includes solar cell modules described in the following aspects.

[Aspect 1] The solar cell module according to Aspect 1 of the present disclosure comprises:
  a substrate;
  an element section disposed on the substrate and including a unit cell;
  a sealer; and
  a first material.

The element section and the first material are housed in a spacesealed with the sealer.

The unit cell includes a pair of electrodes having conductivity and includes a light-absorbing layer, the light-absorbing layer being located between the pair of electrodes and converting light into electric charge.

The light-absorbing layer includes a perovskite compound represented by a compositional formula $AMX_3$, where A represents a monovalent cation, M represents a divalent cation, and X represents a monovalent anion.

The first material is an amine derivative represented by a compositional formula $(Q_1Q_2Q_3\text{-N—H})Y$, where $Q_1$, $Q_2$, and $Q_3$ each independently represent a functional group including at least one element selected from the group consisting of carbon, hydrogen, nitrogen, and oxygen; and Y represents a halogen.

[Aspect 2] In the solar cell module according to Aspect 1, at least one selected from the group consisting of the $Q_1$, $Q_2$, and $Q_3$ may include one to four carbon atoms.

[Aspect 3] In the solar cell module according to Aspect 1 or 2, the first material may be in contact with an inner surface of the sealer or a surface of the element section in the space.

[Aspect 4] In the solar cell module according to any one of Aspects 1 to 3, the sealer may include:
a first portion facing the substrate with a gap therebetween; and a second portion disposed between the substrate and the first portion and surrounding the space.

[Aspect 5] In the solar cell module according to Aspect 4, the first portion may be made of glass; and the second portion may be made of a resin.

[Aspect 6] In the solar cell module according to any one of Aspects 1 to 3, the substrate may be housed in the space.

[Aspect 7] The solar cell module according to any one of Aspects 1 to 6 may further comprise a filler housed in the space.

[Aspect 8] In the solar cell module according to Aspect 7, the first material may be located inside the filler.

[Aspect 9] In the solar cell module according to any one of Aspects 1 to 8, the first material may include a compound represented by a compositional formula AX, where A represents a monovalent cation, and X represents a monovalent anion.

[Aspect 10] In the solar cell module according to any one of Aspects 1 to 9,
a plurality of unit cells may be included in the element section, each of the plurality of unit cells being the unit cell, and
each of the plurality of unit cells may include the pair of electrodes and include the light-absorbing layer.

Embodiments of the present disclosure will now be described with reference to the drawings, but the present disclosure is not limited to the following embodiments. In the description below, although specific numeral values and specific materials may be exemplified, other numerical values and other materials may be applied as long as the effects of the present disclosure are achieved.

Figure 1:
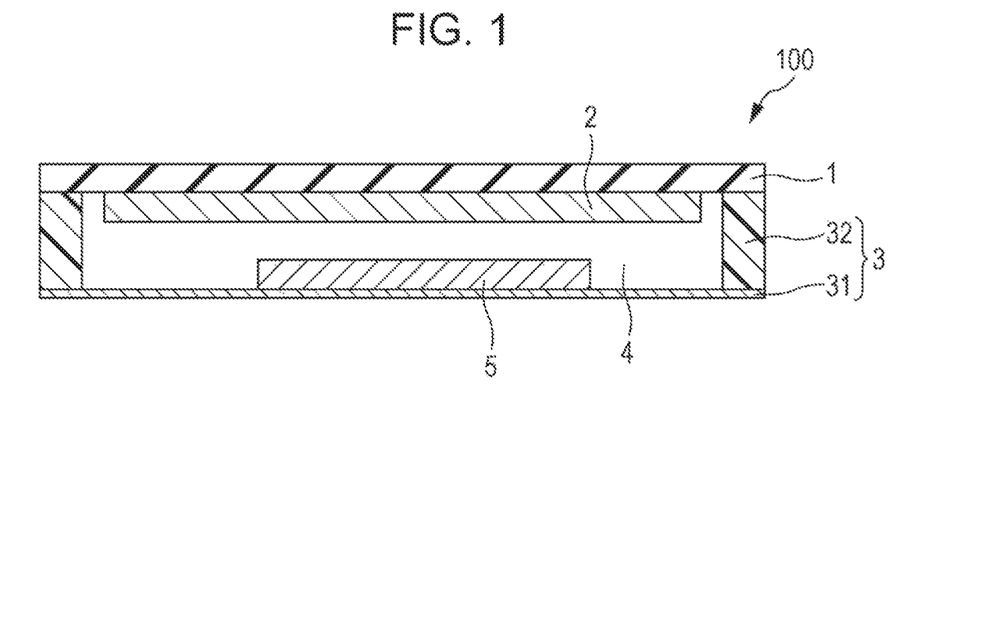
FIG. 1 is a cross-sectional view schematically illustrating an example of the solar cell module of an embodiment.

FIG. 1 is a cross-sectional view schematically illustrating an example of the solar cell module 100 of an embodiment.

The solar cell module 100 includes a substrate 1, an element section 2, a sealer 3, and a first material 5.

The element section 2 is disposed on the substrate 1. The element section 2 includes at least one perovskite solar cell as a unit cell. The element section 2 may include a plurality of unit cells connected in series. Each unit cell includes a pair of electrodes having conductivity and a light-absorbing layer located between the pair of electrodes and converting light into electric charge. Each unit cell may further include a carrier transport layer between one of the electrodes and the light-absorbing layer and/or between the other of the electrodes and the light-absorbing layer. The light-absorbing layer contains, as a light-absorbing material, a perovskite compound represented by a compositional formula $AMX_3$, where A represents a monovalent cation; M represents a divalent cation; and X represents a monovalent anion.

The first material 5 is a decomposition inhibitor preventing the decomposition reaction of the perovskite compound $AMX_3$. The first material 5 is an amine derivative represented by a compositional formula $(Q_1Q_2Q_3\text{-N}\text{---H})Y$. $Q_1$, $Q_2$, and $Q_3$ are each mainly composed of one or more elements selected from carbon, hydrogen, nitrogen, and oxygen. When $Q_1$, $Q_2$, or $Q_3$ contains a carbon atom or atoms, the number of the carbon atom may be four or less. Y represents a halogen. The first material 5 may include a compound represented by a compositional formula AX. The first material 5 may be a solid at ordinary temperature. The first material 5 may have a saturated vapor pressure of 0.2 Pa or more and 100 Pa or less, for example, about 1 Pa at room temperature.

The sealer 3 is disposed so as to seal the element section 2 from the outside. In this example, the substrate 1 and the sealer 3 form a sealed space 4.

The sealer 3 may include a first portion 31 disposed so as to face the substrate 1 with a gap therebetween and a second portion 32 disposed between the substrate 1 and the first portion 31 so as to surround the space. The first portion 31 may be of a plate member, and the second portion 32 may be of a seal member. The distance between the substrate 1 and the first portion 31 may be, for example, 0.1 mm or more and 5 mm or less. The sealer 3 may have a structure in which the first portion 31 and the second portion 32 are unified.

The element section 2 and the first material 5 are located inside the sealed space 4. The first material 5 may be placed at any position inside the sealed space 4. For example, a paint mixed with the first material 5 may be applied to the inner surface of the first portion 31 or the second portion 32 of the sealer 3 inside the sealed space 4 or may be applied to the surface of the element section 2 (for example, the upper surface of an electrode disposed on the side opposite the substrate 1 in each unit cell). Alternatively, the first material 5 be sealed in the sealed space 4 in a powder form.

In order to improve the mechanical strength of the solar cell module 100, a filler may be disposed in a part or the whole of the sealed space 4. In such a case, the first material 5 may be located inside the filler. For example, the first material 5 may be dispersed in the filler. Consequently, even when the sealed space 4 is filled with the filler, the first material 5 can be disposed in the sealed space 4. The filler may contain a resin, such as an ethylene-vinyl acetate (EVA) copolymer resin or a silicone resin.

In this embodiment, the first material 5 is disposed in sealed space 4 in advance. Accordingly, the risk of thermal decomposition of the perovskite compound occurring by operation of the solar cell module 100 for a long time can be prevented. Specifically, the equilibrium of the decomposition reaction of the perovskite compound represented by Expression (1) can be shifted to the left direction. As a result, a decrease in solar cell performance due to decomposition of the perovskite compound can be prevented.

$$ABX_3 \angle AX + BX_2 \qquad (1)$$

The solar cell module 100 may be constituted so as to generate power from light entering the element section 2 from the substrate 1 side. Alternatively, the solar cell module 100 may be constituted so as to generate power from light entering the element section 2 from the first portion 31. At least the substrate 1 or the first portion 31 located on the light incident side has optical transparency.

Each component of the solar cell module 100 will now be described.

Substrate 1

When the solar cell module 100 absorbs light entering from the substrate 1 side to generate power, a substrate having optical transparency can be used as the substrate 1. The substrate 1 is transparent to, for example, solar light with a wavelength of 400 nm or more and 1000 nm or less. In addition, the substrate 1 has a property of not allowing water to pass therethrough to the same extent as that of a glass substrate. As the material of the substrate 1, for example, a transparent insulating material is used. Examples of such materials include glass, alumina, acrylic resins, and polyethylene terephthalate (PET) resins.

In contrast, when the solar cell module 100 absorbs light entering from the first portion 31 side of the sealer 3 to generate power, the substrate 1 has at least a property of not allowing water to pass therethrough to the same extent as that of a glass substrate and need not have optical transparency. In such a case, for example, a metal substrate, such as a stainless steel plate, or an insulating substrate, such as a ceramic plate, can be used as the substrate 1.

Light-Absorbing Layer

The light-absorbing layer of each unit cell constituting the element section 2 contains a compound having a perovskite structure represented by a compositional formula $AMX_3$ as a light-absorbing material. In the formula, A represents a monovalent cation, and examples thereof include alkali metal cations and organic cations.

The monovalent cation represented by A may include an amine derivative hydride represented by $R_1R_2R_3$—N—H. A part of the functional groups $R_1$, $R_2$, and $R_3$ in the amine derivative hydride may be substituted with an element of Group 1, such as Rb and Cs. In such a case, the substitution rate, i.e., the proportion of substitution with an element of Group 1, is 20% or less, for example.

The functional groups $R_1$, $R_2$, and $R_3$ may be each mainly composed of one or more elements selected from carbon, hydrogen, nitrogen, and oxygen. When the functional groups $R_1$, $R_2$, and $R_3$ each include a carbon atom or atoms, the number of the carbon atom may be four or less. As a result, $AMX_3$ can have a perovskite structure or a structure similar thereto. As an example, $R_1$, $R_2$, and $R_3$ may be each independently H, $CH_3$, or $NH_2$. For example, when each of $R_1$ and $R_2$ is H and $R_3$ is $CH_3$, A represents a hydride of methylammonium $CH_3NH_3$.

Examples of other structures of $R_1$, $R_2$, and $R_3$ include the followings. Examples of the compound composed of one or more elements selected from carbon, hydrogen, and nitrogen include $CH_3$, $C_2H_5$, $C_3H_7$, $C_4H_9$, $NH_2$, $NH_2CH_2$, $(NH_2)_2CH$, $(NH_2)_3C$, $NH_2C_2H_4$, $(NH_2)_2C_2H_3$, $(NH_2)_3C_2H_2$, $(NH_2)_4C_2H$, $(NH_2)_5C_2$, $NH_2C_3H_6$, $(NH_2)_2C_3H_4$, $(NH_2)_3C_3H_4$, $(NH_2)_4C_3H_3$, $(NH_2)_5C_3H_2$, $(NH_2)_6C_3H$, $NH_2C_4H_8$, $(NH_2)_2C_4H_7$, $(NH_2)_3C_4H_6$, $(NH_2)_4C_4H_5$, $(NH_2)_5C_4H_4$, $(NH_2)_6C_4H_3$, $(NH_2)_7C_4H_2$, and $(NH_2)_8C_4H$. $R_1$, $R_2$, and $R_3$ may be structural isomers of these exemplified compounds. $R_1$, $R_2$, and $R_3$ may be alcohol type oxidants by oxygen. Examples of the alcohol type oxidant represented by $R_1$, $R_2$, or $R_3$ include $CH_2OH$, $C_2H_4OH$, $C_3H_6OH$, $C_4H_8OH$, $NH_2OH$, $NH_2CHOH$, $NHOHCH_2$, $(NH_2)_2COH$, $NHOHNH_2CH$, $NHOHNH_2COH$, $(NH_2)_3C$, $NHOH(NH_2)_2C$, $(NH_2)_3C$, $NH_2C_2H_3OH$, $NH_2C_2H_2(OH)_2$, $NH_2C_2H(OH)_3$, $NH_2C_2(OH)_4$, $(NH_2)_2C_2H_2OH$, $(NH)_2C_2H (OH)_2$; $(NH_2)_2C_2(OH)_3$, $(NH_2)_3C_2HOH$, $(NH_2)_3C_2(OH)_2$, $(NH_2)_4C_2OH$, $NH_2C_3H_5OH$, $NH_2C_3H_4(OH)_2$, $NH_2C_3H_3(OH)_3$, $NH_2C_3H_2(OH)_4$, $NH_2C_3H(OH)_5$, $NH_2C_3(OH)_6$, $(NH_2)_2C_3H_4OH$, $(NH_2)_2C_3H_3(OH)_2$, $(NH_2)_2C_3H_2(OH)_3$, $(NH_2)_2C_3H(OH)_4$, $(NH_2)_2C_3(OH)_5$, $(NH_2)_3C_3H_3OH$, $(NH_2)_3C_3H_2(OH)_2$, $(NH_2)_3C_3(O)_3$, $(NH_2)_3C_3(OH)_4$, $(NH_2)_4C_3H_2OH$, $(NH_2)_4C_3H(OH)_2$, $(NH_2)_4C_3(OH)_3$, $(NH_2)_5C_3HOH$, $(NH_2)_5C_3(OH)_2$, $(NH_2)_6C_3OH$, $NH_2C_4H_7OH$, $NH_2C_4H_6(OH)_2$, $NH_2C_4H_5(OH)_3$, $NH_2C_4H_4(OH)_4$, $NH_2C_4H_3(OH)_5$, $NH_2C_4H_2(OH)_6$, $NH_2C_4H(OH)_7$, $NH_2C_4(OH)_2$, $(NH_2)_2C_4H_6OH$, $(NH_2)_2C_4H_5(OH)_2$, $(NH_2)_2C_4H_4(OH)_3$, $(NH_2)_2C_4H_3(OH)_4$, $(NH_2)_2C_4H_2(OH)_5$, $(NH_2)_2C_4H(OH)_6$, $(NH_2)_2C_4(OH)_7$, $(NH_2)_3C_4H_5OH$, $(NH_2)_3C_4H_4(OH)_2$, $(NH_2)_3C_4H_3(OH)_3$, $(NH_2)_3C_4H_2(OH)_4$, $(NH_2)_3C_4H(OH)_5$, $(NH_2)_3C_4(OH)_6$, $(NH_2)_4C_4H_4OH$, $(NH_2)_4C_4H_3(OH)_2$, $(NH_2)_4C_4H_2(OH)_3$, $(NH_2)_4C_4H(OH)_4$, $(NH_2)_4C_4(OH)$, $(NH_2)_5C_4H_3OH$, $(NH_2)_5C_4H_2(OH)_2$, $(NH_2)_5C_4H(OH)_3$, $(NH_2)_5C_4(OH)_4$, $(NH_2)_6C_4H_2OH$, $(NH_2)_6C_4H(OH)_2$, $(NH_2)_6C_4(OH)_3$, $(NH_2)_7C_4HOH$, $(NH_2)_7C_4(OH)_2$, and $(NH_2)_5C_4OH$. $R_1$, $R_2$, and $R_3$ also may be ketone or diketone type oxidants or ester type oxidants of the compounds exemplified above. Further, when $R_1$, $R_2$, and $R_3$ are cyclic compounds, examples thereof include pyrrole $C_4H_4NH$, furan $C_4H_4O$, imidazole $C_3H_3NNH$, pyrazole $C_3H_3NNH$, pyrazoline $C_3H_5NNH$, pyrazolidine $C_3H_6NHNH$, oxazole $C_3H_3ON$, isoxazole $C_3H_3ON$, pyrazine $C_4H_4N_2$, pyrimidine $C_4H_4N_2$, and triazine $C_3H_3N_3$; and alcohol type oxidants thereof.

In the formula, B represents a divalent cation. For example, B represents a transition metal or a divalent cation of Group 13 to Group 15. More specifically, examples of the divalent cation represented by B include $Pb^{2+}$, $Ge^{2+}$, and $Sn^{2+}$. As an example, B may represent $Pb^{2+}$, $Sn^{2+}$, or a mixture thereof. When B represents any of $Pb^{2+}$, $Sn^{2+}$, and a mixture of $Pb^{2+}$ and $Sn^{2+}$, a part of at least one of $Pb^{2+}$ and $Sn^{2+}$ may be substituted with another element. Examples of the substitution element include Bi, Sb, In, Ge, and Ni.

In the formula, X represents a monovalent anion such as a halogen anion. X may represent any anion of Cl, Br, and I or a mixture of two or more of these anions.

Each site of A, M, and X may be occupied by multiple types of ions. Examples of the compound having a perovskite structure include $CH_3NH_3PbI_3$, $CH_3CH_2NH_3PbI_3$, $NH_2CHNH_2PbI_3$, $CH_3NH_3PbBr_3$, $CH_3NH_3PbCl$, $CsPbI_3$, and $CsPbBr_3$.

First Portion 31 of Sealer 3

The first portion 31 is, for example, a plate member disposed so as to face the substrate 1 with a gap therebetween.

When the solar cell module 100 absorbs light entering from the substrate 1 side to generate power, the plate member may have only a property of not allowing water to pass therethrough to the same extent as that of a glass substrate and need not have optical transparency. Examples of the plate member include metal substrates, such as a stainless steel plate; and insulating substrates, such as a glass substrate and a ceramic plate.

When the solar cell module 100 absorbs light entering from the side opposite the substrate 1 to generate power, the plate member has optical transparency and has a property of not allowing water to pass therethrough to the same extent as that of a glass substrate. The plate member may be transparent to, for example, solar light with a wavelength of 400 nm or more and 1000 nm or less. Examples of the plate member include transparent substrates, such as a glass substrate and a plastic substrate.

Second Portion 32 of Sealer 3

The second portion 32 is, for example, a seal member located between the substrate 1 and the first portion 31.

One of the upper end and the lower end of the seal member may be in contact with the periphery of the substrate 1, and the other may be in contact with the periphery of the plate member as the first portion 31. Consequently, the substrate 1 and the sealer 3 including the plate member and the seal member can form a space 4 sealed from the outside in the solar cell module 100.

The seal member has, for example, a gas barrier property of not allowing gas to pass therethrough. In addition, the seal member has, for example, high adhesiveness to both the substrate 1 and the first portion 31. Examples of the material of the seal member include resin materials, such as polyisobutylene and copolymers of isobutylene and isoprene.

The seal member may have a layered structure. The seal member may have, for example, a two-layer structure including a first resin layer and a second resin layer disposed on the inner side of the first resin layer and having a gas barrier property higher than that of the first resin layer. Consequently, the gas barrier property of the seal member can be further enhanced. Examples of the material of the first resin layer include materials having high adhesiveness, such as polyisobutylene and copolymers of isobutylene and isoprene. As the material of the second resin layer, for example, a resin material that is inferior in adhesiveness to the material of the first resin layer but has excellent gas barrier properties may be used. Examples of such resin materials include polytetrafluoroethylene, polychlorofluoroethylenen, and chlorinated natural rubber.

First Material 5

The first material 5 is an amine derivative hydrohalogenic acid salt represented by a compositional formula $(Q_1Q_2Q_3\text{-}N\text{---}H)Y$. In the formula, Y represents a halogen and may represent, for example, iodine, bromine, or chlorine. In the formula, the functional groups $Q_1$, $Q_2$, and $Q_3$ are each mainly composed of one or more elements selected from carbon, hydrogen, nitrogen, and oxygen. When $Q_1$, $Q_2$, or $Q_3$ contains a carbon atom or atoms, the number of the carbon atom may be four or less. Examples of the structures of $Q_1$, $Q_2$, and $Q_3$ include H, $CH_3$, $C_2H_5$, $C_3H_7$, $C_4H_9$, $NH_2$, $NH_2CH_2$, $(NH_2)_2CH$, $(NH_2)_3C$, $NH_2C_2H_4$, $(NH_2)_2C_2H_3$, $(NH_2)_3C_2H_2$, $(NH_2)_4C_2H$, $(NH_2)_5C_2$, $NH_2C_3H_6$, $(NH_2)_2C_3H_5$, $(NH_2)_3C_3H_4$, $(NH_2)_4C_3H_3$, $(NH_2)_5C_3H_2$, and $(NH_2)_6C_3H$. The structures of $Q_1$, $Q_2$, and $Q_3$ may be structural isomers of these exemplified structures. Further, when $Q_1$, $Q_2$, or $Q_3$ represents an alcohol type oxidant by oxygen, examples thereof include $CH_2OH$, $C_2H_4OH$, $C_3H_6OH$, $C_4H_8OH$, $NH_2OH$, $NH_2CHOH$, $NHOHCH_2$, $(NH_2)_2COH$, $NHOHNH_2CH$, $NHOHNH_2COH$, $(NH_2)_3C$, $NHOH(NH_2)_2C$, $(NH_2)_3C$, $NH_2C_2H_3OH$, $NH_2C_2H_2(OH)_2$, $NH_2C_2H(OH)_3$, $NH_2C_2(OH)_4$, $(NH_2)_2C_2H_2OH$, $(NH_2)_2C_2H(OH)_2$, $(NH_2)_2C_2(OH)_3$, $(NH_2)_3C_2HOH$, $(NH_2)_3C_2(OH)_2$, $(NH_2)_4C_2OH$, $NH_2C_3H_5OH$, $NH_2C_3H_4(OH)_2$, $NH_2C_3H_3(OH)_3$, $NH_2C_3H_2(OH)_4$, $NH_2C_3H(OH)_5$, $NH_2C_3(OH)_6$, $(NH_2)_2C_3H_4OH$, $(NH_2)_2C_3H_3(OH)_2$, $(NH_2)_2H_3$, $(NH_2)_2C_3H_3H_2(OH)_4$, $(NH_2)_2C_3(OH)_5$, $(NH_2)_3C_3H_3OH$, $(NH_2)_3C_3H_2(OH)_2$, $(NH_2)_3C_3H(OH)_3$, $(NH_2)_3C_3(OH)_4$, $(NH_2)_4C_3H_2OH$, $(NH_2)_4C_3H(OH)_2$, $(NH_2)_4C_3(OH)_3$, $(NH_2)_5C_3HOH$, $(NH_2)_5C_3(OH)_2$, $(NH_2)_6C_3OH$, $NH_2C_4H_7OH$, $NH_2C_4H_6(OH)_2$, $NH_2C_4H_5(OH)_3$, $NH_2C_4H_4(OH)_4$, $NH_2C_4H_3(OH)_5$, $NH_2C_4H_2(OH)_6$, $NH_2C_4H(OH)_7$, $NH_2C_4(OH)_8$, $(NH_2)_2C_4H_6OH$, $(NH_2)_2C_4H_5(OH)_2$, $(NH_2)_2C_4H_4(OH)_3$, $(NH_2)_2C_4H_3(OH)_4$, $(NH_2)_2C_4H_2(OH)_5$, $(NH_2)_2C_4H(OH)_6$, $(NH_2)_2C_4(OH)_7$, $(NH_2)_3C_4H_5OH$, $(NH_2)_3C_4H_4(OH)_2$, $(NH_2)_3C_4H_3(OH)_3$, $(NH_2)_3C_4H_2(OH)_4$, $(NH_2)_3C_4H(OH)_5$, $(NH_2)_3C_4(OH)_6$, $(NH_2)_4C_4H_4OH$, $(NH_2)_4C_4H_3(OH)_2$, $(NH_2)_4C_4H_2(OH)_3$, $(NH_2)_4C_4H(OH)_4$, $(NH_2)_4C_4(OH)_5$, $(NH_2)_5C_4H_3OH$, $(NH_2)_5C_4H_2(OH)_2$, $(NH_2)_5C_4H(OH)_3$, $(NH_2)_5C_4(OH)_4$, $(NH_2)_6C_4H_2OH$, $(NH_2)_6C_4H(OH)_2$, $(NH_2)_6C_4(OH)_3$, $(NH_2)_7C_4HOH$, $(NH_2)_7C_4(OH)_2$, and $(NH_2)_8C_4OH$. In addition, the first material 5 may be, for example, a ketone type oxidant or an ester type oxidant of the structures exemplified above. Furthermore, when $Q_1$, $Q_2$, or $Q_3$ represents a cyclic compound, examples thereof include pyrrole $C_4H_4NH$, furan $C_4H_4O$, imidazole $C_3H_3NNH$, pyrazole $C_3H_3NNH$, pyrazoline $C_3H_5NNH$, pyrazolidine $C_3H_6NHNH$, oxazole $C_3H_3ON$, isoxazole $C_3H_3ON$, pyrazine $C_4H_4N_2$, pyrimidine $C_4H_4N_2$, and triazine $C_3H_3N_3$; and alcohol type oxidants thereof.

The first material 5 may include two or more amine derivative hydrohalogenic acid salts, as long as at least one amine derivative as exemplified above is included. The first material 5 may include, for example, an amine derivative AV generated by decomposition of the perovskite compound $AMX_3$.

Element Section 2

Figure 2:
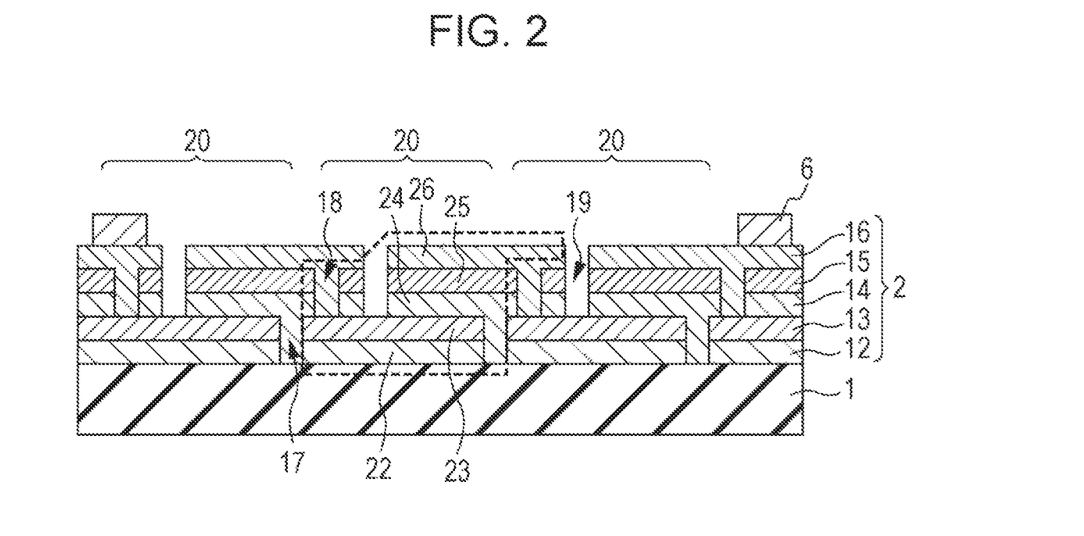
FIG. 2 is a schematic cross-sectional view illustrating an example of the element section of a solar cell module.

The element section 2 may have any structure having at least one perovskite solar cell as a unit cell. An example of the structure of the element section 2 will now be described.

FIG. 2 is a schematic cross-sectional view illustrating an example of the element section 2 in this embodiment.

The element section 2 is supported by the substrate 1 and includes a plurality of unit cells 20 connected in series. In FIG. 2, one unit cell 20 is indicated with a broken line for easy understanding. Herein, three unit cells 20 are shown, but the number of the unit cells 20 is not particularly limited.

The element section 2 includes a first electrode film 12, a first semiconductor film 13, a second semiconductor film 14, a third semiconductor film 15, and a second electrode film 16 sequentially layered on the substrate 1. The first semiconductor film 13, the second semiconductor film 14, and the third semiconductor film 15 form junction for generating photovoltaic power.

In this example, the substrate 1 has optical transparency, and light entering the element section 2 from the substrate 1 side is absorbed to generate power. In such a case, for example, the first semiconductor film 13 can form an electron transport layer 23 of each unit cell 20; the second semiconductor film 14 can form a light-absorbing layer 24 of each unit cell 20; and the third semiconductor film 15 can form a hole transport layer 25 of each unit cell 20. Specifically, the first electrode film 12 and the first semiconductor film 13 are divided into multiple first electrodes 22 and multiple electron transport layers 23, respectively, by a first dividing groove 17. The second semiconductor film 14 and the third semiconductor film 15 are divided into multiple light-absorbing layers 24 and multiple hole transport layers 25, respectively, by a second dividing groove 18. The second electrode film 16 is divided into multiple second electrodes 26 by a third dividing groove 19. The third dividing groove 19 may be formed also in the second semiconductor film 14 and the third semiconductor film 15. The first dividing groove 17, the second dividing groove 18, and the third dividing groove 19 may extend, for example, in a stripe form. These grooves may be formed in approximately parallel to one another.

As shown in FIG. 2 with a broken line, the multiple unit cells 20 each have a structure in which the first electrode 22, the electron transport layer 23, the light-absorbing layer 24, the hole transport layer 25, and the second electrode 26 are laminated in this order on the substrate 1. The second dividing groove 18 is disposed so as to overlap with the first electrode 22 and the electron transport layer 23 when viewed from the normal direction of the substrate 1. In the second dividing groove 18, the second electrode 26 of an adjacent unit cell 20 is disposed. The first electrode 22 is electrically connected to the second electrode 26 of an adjacent unit cell 20 in the second dividing groove 18 via the electron transport layer 23. That is, the second dividing groove 18 functions as a unit cell connecting groove.

Thus, each unit cell 20 is an independent solar cell including an electron transport layer 23, a light-absorbing layer 24, and a hole transport layer 25 forming junction, and a first electrode 22 and a second electrode 26 as output terminals. The first electrode 22 of a certain unit cell 20 is electrically connected to the second electrode 26 of one of the unit cells 20 adjacent on both sides, and the second electrode 26 of the certain unit cell 20 is electrically connected to the first electrode 22 of the other adjacent unit cell 20. In such a manner, a plurality of unit cells 20 are connected in series.

The element section 2 is connected to a pair of power lines 6 for extracting power. One of the pair of power lines 6 is electrically connected to the first electrode 22 of the unit cell 20 located on one end of the connection structure composed of multiple unit cells 20, for example, via the second electrode film 16. The other of the power lines 6 is electrically connected to the second electrode of the unit cell 20 located on the other end of the connection structure. These power lines 6 extend from the inside of the space 4 sealed with the sealer to the outside.

The first electrode 22 has conductivity and optical transparency. Examples of the material of the first electrode 22 include transparent conductive materials, such as fluorine-doped tin oxide and indium tin oxide. The first electrode 22 may have a sheet resistance of, for example, 40 ohm/sq or less or 10 ohm/sq or less. When the substrate 1 is a glass substrate, the layered product of the substrate 1 and the first electrode 22 may have a light transmittance of 85% or more in a wavelength range of 450 nm or more and 900 nm or less.

The solar cell performance can be further enhanced by increasing the haze rate of the first electrode 22. The haze rate of the first electrode 22 may be about 10% (for example, 8% or more and 15% or less), although it varies depending on the thickness of the electron transport layer 23. Consequently, the electron transport layer 23 can more certainly cover the irregularity of the first electrode 22, while ensuring the solar cell performance.

The second electrode 26 has conductivity. The second electrode 26 need not have optical transparency. The material of the second electrode 26 may be a transparent conductive material as in the first electrode 22 or may be a conductive material, such as Au, C, or Al.

The materials of the electron transport layer 23, the light-absorbing layer 24, and the hole transport layer 25 are not particularly limited. Examples of the material of the electron transport layer 23 include anatase-type titanium oxide and tin oxide. Examples of the material of the light-absorbing layer 24 include light-absorbing materials containing perovskite compounds described above.

Examples of the material of the hole transport layer 25 include 2,2',7,7'-tetrakis(N, N'-di-p-methoxyphenylamine)-9-9'-spirobifluorene (Spiro-OMeTAD).

The first dividing groove 17 is formed by partially removing the first electrode film 12 and the first semiconductor film 13. The first dividing groove 17 can be formed by scribing with light having a wavelength that is absorbed by the first electrode film 12 and the first semiconductor film 13. For example, the first dividing groove 17 may be formed by irradiating the first electrode film 12 and the first semiconductor film 13 with YAG laser (wavelength: 165 nm). The first dividing groove 17 may have a width of, for example, 20 μm or more and 150 μm or less.

The second dividing groove 18 is formed by partially removing the second semiconductor film 14 and the third semiconductor film 15. The first semiconductor film 13 is exposed in the bottom of the second dividing groove 18. In the second dividing groove 18, the first semiconductor film 13 and the second electrode film 16 are in direct contact with each other and are electrically connected to each other. The second dividing groove 18 is formed by, for example, laser scribing through collection of laser light and irradiation with the light or mechanical scribing through scraping with a hardened metal blade. As an example, the second semiconductor film 14 and the third semiconductor film 15 absorbing light having a longer wavelength may be removed by mechanical scribing, and the first semiconductor film 13 may be then laser scribed for impurity doping. The second dividing groove 18 has a width of, for example, 150 μm or more and 300 rpm or less.

The third dividing groove 19 may be formed by partially removing the second semiconductor film 14, the third semiconductor film 15, and the second electrode film 16. The third dividing groove 19 divides at least the second electrode film 16, and the second semiconductor film 14 and/or the third semiconductor film 15 need not be divided by the third dividing groove 19. The third dividing groove 19 can be formed as in the first dividing groove or the second dividing groove. The third dividing groove 19 has a width of, for example, 30 μm or more and 50 μm or less.

The element section 2 may be constituted so as to generate power from light entering from the second electrode 26 side by using a material having conductivity and optical transparency for the second electrode 26. In such a case, the first semiconductor film 13 may form the hole transport layer of each unit cell 20, the second semiconductor film 14 may form the light-absorbing layer of each unit cell 20, and the third semiconductor film 15 may form the electron transport layer of each unit cell 20.

The element section 2 can be produced by, for example, as follows.

A first electrode film 12 and a first semiconductor film 13 are first formed in this order on a substrate 1. A first dividing groove 17 is then formed in the first electrode film 12 and the first semiconductor film 13 by laser scribing to cut the first electrode film 12 and the first semiconductor film 13 in strip forms. Subsequently, a second semiconductor film 14 and a third semiconductor film 15 are formed in this order on the first semiconductor film 13. A second dividing groove 18 is then formed in the second semiconductor film 14 and the third semiconductor film 15 by mechanical scribing. Subsequently, a second electrode film 16 is formed on the third semiconductor film 15. Subsequently, a third dividing groove 19 is formed in the second semiconductor film 14, the third semiconductor film 15, and the second electrode film 16. A power line 6 is then bonded to the second electrode film 16. An element section 2 is thus formed.

Modification of Solar Cell Module

Figure 3A:
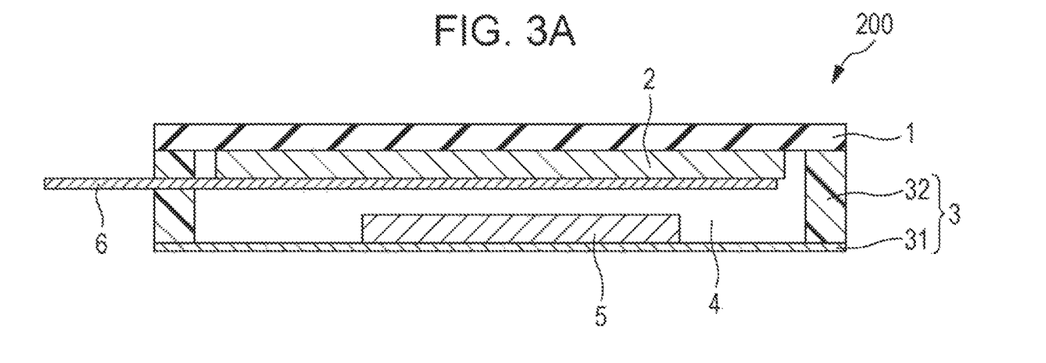
FIG. 3A is a schematic cross-sectional view illustrating a solar cell module of a first modification.
Figure 3B:
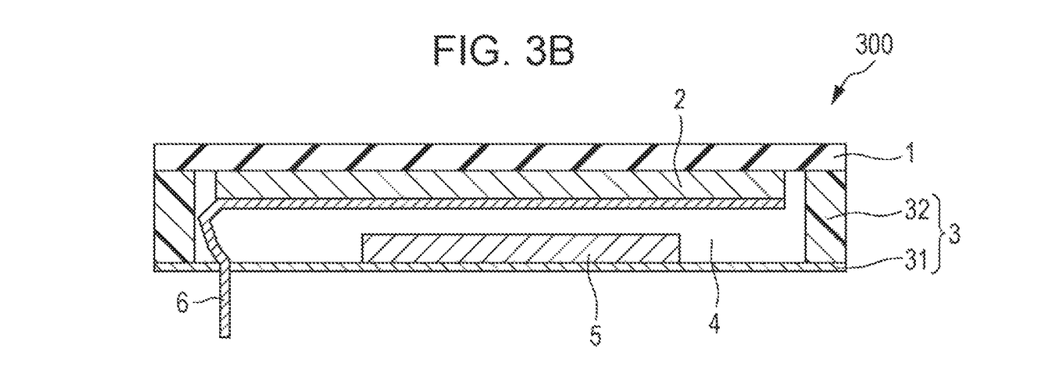
FIG. 3B is a schematic cross-sectional view illustrating a solar cell module of a second modification.

FIGS. 3A and 3B are schematic cross-sectional views illustrating solar cell modules 200 and 300 according to a first modification and a second modification, respectively, of the embodiment.

The solar cell modules 200 and 300 differ from the solar cell module 100 shown in FIG. 1 in that they each include a pair of power lines 6 for extracting the power generated in the element section 2. In FIGS. 3A and 3B, only one of the pair of power lines 6 is shown. One of the power lines 6 is connected to the positive electrode of the unit cell located on one end of a plurality of unit cells connected in series in the element section 2, and the other of the power lines 6 is connected to the negative electrode of the unit cell located on the other end of the plurality of unit cells connected in series.

Each power line 6 extends from the inside of the sealed space 4 to the outside of the solar cell module 200, 300. As shown in FIG. 3A, the power line 6 may pierce through the second portion (e.g., seal member) 32 and extend to the outside. Alternatively, as shown in FIG. 3B, the power line 6 may extend to the outside through the opening provided to the first portion (e.g., plate member) 31.

In such a case, the periphery region of the opening may be sealed with, for example, a resin for maintaining the airtightness of the sealed space 4. For example, a terminal box may be bonded to the outside of the plate member so as to cover the opening for potting with a resin.

The power line 6 has conductivity. Examples of the material of the power line 6 include metal materials, such as Cu and Al.

Figure 3C:
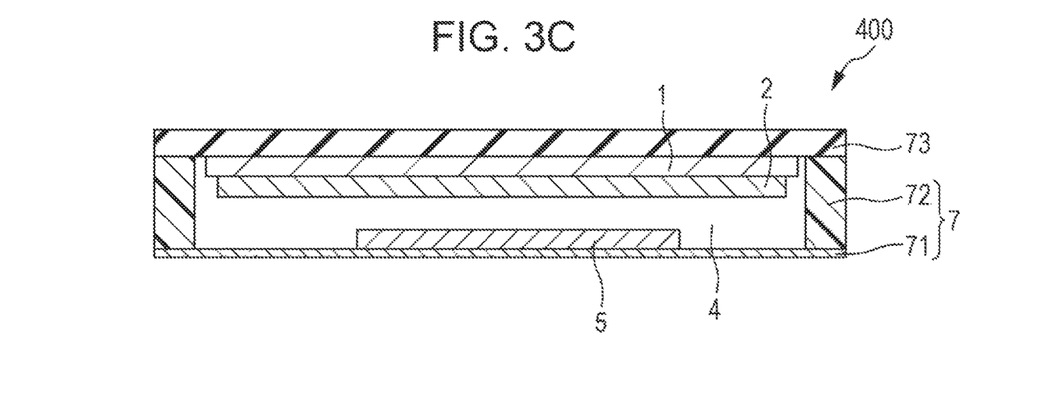
FIG. 3C is a schematic cross-sectional view illustrating a solar cell module of a third modification.

FIG. 3C is a schematic cross-sectional view illustrating a solar cell module 400 according to a third modification of the embodiment.

The solar cell module 400 differs from the solar cell module 100 in that the sealer 7 seals not only the element section 2 but also the substrate 1 supporting the element section 2. In the solar cell module 400, the substrate 1, the element section 2, and the first material 5 are located in the sealed space 4 formed by the sealer 7.

Such a sealer 7 may include, for example, a first plate member 71 and a second plate member 73 disposed so as to face each other with a gap therebetween and a seal member 72. The seal member 72 is disposed between the first plate member 71 and the second plate member 73 so as to surround the sealed space 4. One of the upper end and the lower end of the seal member 72 may be in contact with the periphery of the first plate member 71, and the other may be in contact with the periphery of the second plate member 73.

Example 1 and Comparative Example 1

Solar cell modules of Example 1 and Comparative Example 1 were produced, and the relationship between the operation time and the output characteristics in each solar cell module was investigated.

Example 1

The structure of the solar cell of Example 1 and a method of producing it will now be described.

The solar cell module of Example 1 has substantially the same structure as that of the solar cell module 200 shown in FIG. 3A. The element section 2 has a structure described with reference to FIG. 2. The material and the thickness of each component of the solar cell module of Example 1 are shown below:

Substrate 1: glass substrate, 200×200 mm, thickness: 1 mm;
First electrode 22: fluorine-doped $SnO_2$ layer (surface resistance: 8 ohm/sq), thickness: 800 nm;
Electron transport layer 23: anatase-type $TiO_2$, thickness: 10 nm;
Light-absorbing layer 24: $CH_3NH_3PbI_3$, thickness: 500 nm;
Hole transport layer 25: Spiro-OMeTAD, thickness: 500 nm;
Second electrode 26: Au, thickness: 200 nm;
First portion 31 of sealer 3: glass substrate;
Second portion 32 of sealer 3: butyl rubber (isoprene-isobutene copolymer, average molecular weight: about 10000); and
Power line 6: Al, thickness: 200 µm width: 3 mm.

The method of producing the solar cell of Example 1 is as follows.

A fluorine-doped tin oxide film serving as a first electrode film 12 and a $TiO_2$ film serving as a first semiconductor film 13 were formed on a surface of a glass substrate as a substrate 1 by sputtering. Subsequently, a first dividing groove 17 having a width of 50 µm was formed in the first electrode film 12 and the first semiconductor film 13 by laser scribing (wavelength: 16 µm).

Subsequently, 0.07 mol of methyl ammonium hydroiodide $CH_3NH_3I$ and 0.07 mol of lead iodide $PbI_2$ were weighed as raw materials of a perovskite compound $CH_3NH_3PbI_3$ and were dissolved in 100 mL of dimethyl sulfoxide (hereinafter, referred to as DMSO) to prepare a first coating liquid. The resulting first coating liquid (10 mL) was applied onto the surface of the $TiO_2$ film serving as the first semiconductor film 13 by spin coating (2000 rpm, 2 min). Subsequently, the substrate applied with the coating liquid was immersed in toluene and was heated at 120° C. for 60 minutes to form a $CH_3NH_3PbI_3$ film having a thickness of 500 nm as a second semiconductor film 14.

Separately, 0.4 mL of an acetonitrile solution containing 1.8 mol/L of lithium bis(trifluoromethanesulfonyl)imide (hereinafter, referred to as LiTFSI), 0.4 mL of an acetonitrile solution containing 1.6 mol/L of $CoPF_6$, and 2.5 mL of tert-butylpyridine were added to 82 mL of a chlorobenzene solution containing 0.06 mol/L of Spiro-OMeTAD to prepare a second coating liquid. The second coating liquid (5 mL) was applied onto the surface of the second semiconductor film 14 by spin coating (1500 rpm, 30 sec). Consequently, a film having a thickness of 500 nm and mainly made of Spiro-OMeTAD was formed as a third semiconductor film 15.

Subsequently, a second dividing groove 18 having a width of 200 µm was formed in the second semiconductor film 14 and the third semiconductor film 15 by mechanical scribing.

Subsequently, an Au film having a thickness of 200 nm was formed as a second electrode film 16 by vacuum vapor deposition.

A third dividing groove 19 having a width of 50 am was then formed in the second semiconductor film 14, the third semiconductor film 15, and the second electrode film 16 by mechanical scribing to give an element section 2.

Herein, the element section 2 having a size of 175×175 mm was formed on a glass substrate (200×200 mm) as the substrate 1. The element section 2 was formed on the inner side of the periphery (width: 12.5 mm) of the glass substrate. In the element section 2, each dividing groove was formed such that 35 unit cells were connected in series.

Subsequently, power lines 6 of aluminum were bonded to ends of the element section 2 with silver paste. A solar cell element of Example 1 was thus formed on the substrate 1.

Subsequently, the substrate 1 provided with the element section 2 and a glass substrate as a plate member being the first portion 31 were arranged so as to face each other with a gap of about 1 mm therebetween, and 100 mg of a powder of methyl ammonium hydroiodide $CH_3NH_3I$ as a first material 5 was placed in the gap between the substrate 1 and the plate member, while securing the gap of 1 mm.

Subsequently, hot-melt butyl rubber as a seal member being the second portion 32 was poured between the substrate 1 and the plate member so as to surround the element section 2. The seal member was disposed so as to join the periphery of the substrate 1 and the periphery of the plate member. The seal member had a width of 5 mm. A sealed space 4 hermetically sealed with the substrate 1, the plate member, and the seal member was thus formed. The power lines 6 were extracted from the inside of the sealed space 4 to the outside by piercing through the seal member. The solar cell module of Example 1 was thus produced.

Comparative Example 1

A solar cell module of Comparative Example 1 was produced as in Example 1 except that methyl ammonium hydroiodide $CH_3NH_3I$ as the first material 5 was not disposed between the substrate 1 and the first portion 31 of the sealer 3. The components other than the first material 5 were the same as those in Example 1.

Evaluation of Photoelectric Conversion Characteristics

Two each of the solar cell modules of Example 1 and Comparative Example 1 were produced, and the photoelectric conversion characteristics of the modules were evaluated. Herein, the solar cell modules were placed in the atmosphere at room temperature for 400 days, and changes in output of the solar cell modules were measured under the conditions of pseudo sunlight irradiation with a light intensity of 1 $kW/m^2$.

Figure 4:
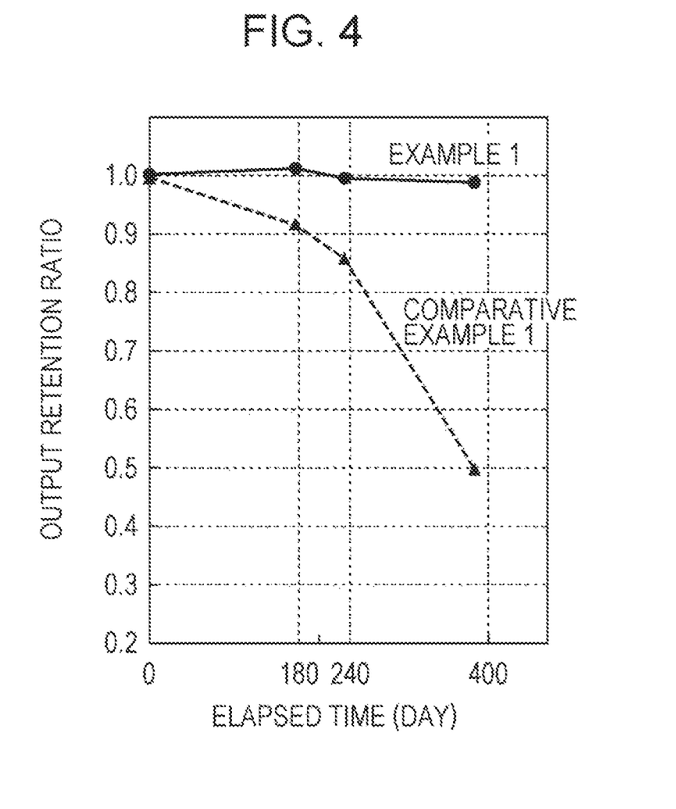
FIG. 4 is a graph showing the output retention ratios of the solar cell modules of Example 1 and Comparative Example 1.

FIG. 4 is a graph showing the output retention ratios of the solar cell modules of Example 1 and Comparative Example 1. The output retention ratios of Example 1 and Comparative Example 1 shown in FIG. 4 are each the average of the output retention ratios of two solar cell modules. Herein, the term "output retention ratio" refers to the ratio of the output of a solar cell module after a predetermined time has elapsed to the output of the solar cell module immediately after production.

As obvious from the results shown in FIG. 4, in the solar cell modules of Comparative Example 1 in which the first material 5 was not disposed in the sealed space 4, the output after 400 days elapse decreased to about 50%. In contrast to this, in the solar cell modules of Example 1 in which the first material 5 was disposed in the sealed space 4, a reduction in output was hardly observed even after 400 days elapse. It is inferred that the results were obtained by placing the first material 5 in the sealed space 4 containing the element section 2 and thereby preventing the perovskite compound from being decomposed during the operation or storage of the solar cell module for a long time.

Example 2 and Comparative Example 2

Solar cell modules of Example 2 and Comparative Example 2 were produced, and the relationship between the operation time and the output characteristics in each solar cell module was investigated. The solar cell modules of Example 2 and Comparative Example 2 differ from the solar cell modules of Example 1 and Comparative Example 1, respectively, in the materials of the light-absorbing layer 24 and the hole transport layer 25.

Figure 5:
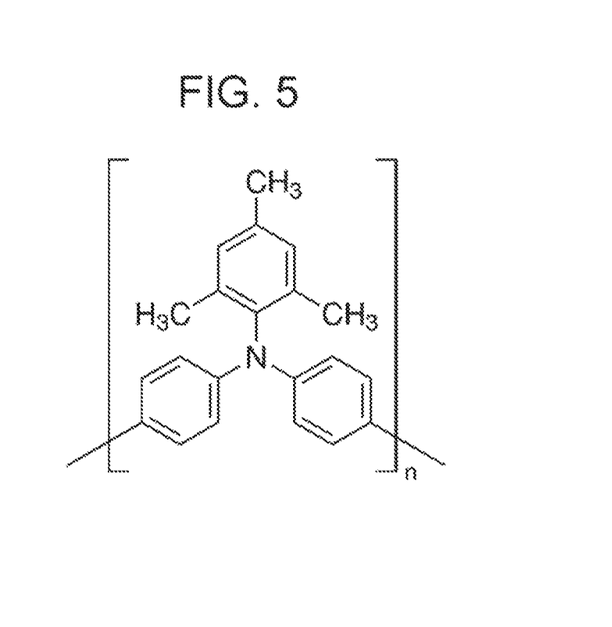
FIG. 5 is a diagram illustrating the structural formula of poly[bis(4-phenyl)(2,4,6-trimethylphenyl)amine]

In the solar cell modules of Example 2 and Comparative Example 2, the material of the absorbing layer 24 was a perovskite compound represented by a formula $(Cs_{0.05}Rb_{0.025}(NH_2CHNH_2)_{0.768}(CH_3NH_3)_{0.157})Pb(I_{0.975}Br_{0.025})_3$, and the material of the hole transport layer 25 was poly[bis(4-phenyl)(2,4,6-trimethylphenyl)amine] (hereinafter, referred to as PTAA). The structural formula of PTAA is shown in FIG. 5.

Example 2

The structure of the solar cell of Example 2 and a method of producing it will now be described.

The solar cell module of Example 2 has substantially the same structure as that of the solar cell module 200 shown in FIG. 3A. The element section 2 has the structure described with reference to FIG. 2. The material and the thickness of each component of the solar cell module of Example 2 are shown below:

Substrate 1: glass substrate, 200×200 mm, thickness: 1 mm

First electrode 22: fluorine-doped $SnO_2$ layer (surface resistance: 8 ohm/sq), thickness: 800 nm;

Electron transport layer 23: anatase-type $TiO_2$, thickness: 10 nm;

Light-absorbing layer 24: $(Cs_{0.05}Rb_{0.025}(NH_2CHNH_2)_{0.768}(CH_3NH_3)_{0.157})Pb(I_{0.975}Br_{0.025})_3$, thickness: 500 nm;

Hole transport layer 25: PTAA, thickness: 50 nm;
Second electrode 26: Au, thickness: 200 nm;
First portion 31 of sealer 3: glass substrate;
Second portion 32 of sealer 3: butyl rubber (isoprene-isobutene copolymer, average molecular weight: about 10000); and
Power line 6: Al, thickness: 200 μm, width: 3 mm.

The method of producing the solar cell of Example 2 is as follows.

A fluorine-doped tin oxide film serving as a first electrode film 12 and a $TiO_2$ film serving as a first semiconductor film 13 were formed on a surface of a glass substrate as a substrate 1 by sputtering. Subsequently, a first dividing groove 17 having a width of 50 μm was formed in the first electrode film 12 and the first semiconductor film 13 by laser scribing (wavelength: 16 μm).

Subsequently, 0.005 mol of cesium iodide CsI, 0.0025 mol of rubidium iodide RbI, 0.0768 mol of formamidinium hydroiodide $NH_2CHNH_2I$, 0.0157 mol of methyl ammonium hydroiodide $CH_3NH_3$, and 0.0025 mol of methyl ammonium hydrobromate $CH_3NH_3Br$ were weighed as raw materials of a perovskite compound $(Cs_{0.05}Rb_{0.025}(NH_2CHNH_2)_{0.768}(CH_3NH_3)_{0.157})Pb(I_{0.975}Br_{0.025})_3$ and were dissolved in 130 mL of DMSO to prepare a first coating liquid. The resulting first coating liquid (10 mL) was applied onto the surface of the $TiO_2$ film as the first semiconductor film 13 by spin coating (2000 rpm, 2 min). Subsequently, the substrate applied with the coating liquid was immersed in toluene and was heated at 120° C. for 60 minutes to form a $(Cs_{0.05}Rb_{0.025}(NH_2CHNH_2)_{0.768}(CH_3NH_3)_{0.157})Pb(I_{0.975}Br_{0.25})_3$ film having a thickness of 500 nm as a second semiconductor film 14.

Separately, 1 g of a PTAA powder was dissolved in 100 m L of toluene, and 4.8 mL of an acetonitrile solution containing 1.8 mol/L LiTFSI and 0.6 mL of tert-butylpyridine were added to the toluene solution to prepare a second coating liquid. The second coating liquid (5 mL) was applied onto the surface of the second semiconductor film 14 by spin coating (1500 rpm, 30 sec). Consequently, a film having a thickness of 50 nm and mainly made of PTAA was formed as a third semiconductor film 15.

Subsequently, a second dividing groove 18 having a width of 200 μm was formed in the second semiconductor film 14 and the third semiconductor film 15 by mechanical scribing.

Subsequently, an Au film having a thickness of 200 nm was formed as a second electrode film 16 by vacuum vapor deposition.

A third dividing groove 19 having a width of 50 μm was then formed in the second semiconductor film 14, the third semiconductor film 15, and the second electrode film 16 by mechanical scribing to give an element section 2.

Herein, the element section 2 having a size of 175×175 mm was formed on a glass substrate (200×200 mm) as the substrate 1. The element section 2 was formed on the inner side of the periphery (width: 12.5 mm) of the glass substrate. In the element section 2, each dividing groove was formed such that 35 unit cells were connected in series.

Subsequently, power lines 6 of aluminum were bonded to ends of the element section 2 with silver paste. A solar cell element of Example 2 was thus formed on the substrate 1.

Subsequently, the substrate 1 provided with the element section 2 and a glass substrate as a plate member being the first portion 31 were arranged so as to face each other with a gap of about 1 mm therebetween, and 100 mg of a powder of methyl ammonium hydroiodide $CH_3NH_3I$ as a first material 5 was placed in the gap between the substrate 1 and the plate member, while securing the gap of 1 mm.

Subsequently, hot-melt butyl rubber as a seal member being the second portion 32 was poured between the substrate 1 and the plate member so as to surround the element section 2. The seal member was disposed so as to join the periphery of the substrate 1 and the periphery of the plate member. The seal member had a width of 5 mm. A sealed space 4 hermetically sealed with the substrate 1, the plate member, and the seal member was thus formed. The power lines 6 were extracted from the inside of the sealed space 4 to the outside by piercing through the seal member. The solar cell module of Example 2 was thus produced.

Comparative Example 2

A solar cell module of Comparative Example 2 was produced as in Example 2 except that methyl ammonium hydroiodide $CH_3NH_3I$ as the first material 5 was not disposed between the substrate 1 and the first portion 31 of the sealer 3. The components other than the first material 5 were the same as those in Example 2.

Evaluation of Photoelectric Conversion Characteristics

One each of the solar cell modules of Example 2 and Comparative Example 2 were produced, and the photoelectric conversion characteristics of the modules were evaluated. Herein, the solar cell modules were placed in the atmosphere at room temperature for 26 days, and changes in output of the solar cell modules were measured under the conditions of pseudo sunlight irradiation with a light intensity of 1 $kW/m^2$.

Figure 6:
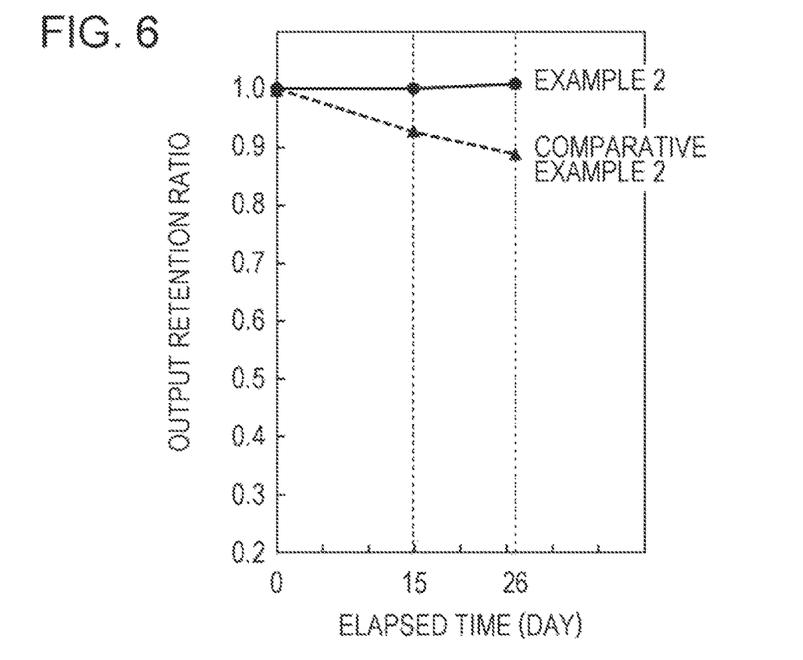
FIG. 6 is a graph showing the output retention ratios of the solar cell modules of Example 2 and Comparative Example 2.

FIG. 6 is a graph showing the output retention ratios of the solar cell modules of Example 2 and Comparative Example 2.

As obvious from the results shown in FIG. 6, in the solar cell module of Comparative Example 2 in which the first material 5 was not disposed in the sealed space 4, the output after 26 days elapse decreased to about 90%. In contrast to this, in the solar cell modules of Example 2 in which the first material 5 was disposed in the sealed space 4, a reduction in output was hardly observed even after 26 days elapse. It is inferred that the results were obtained by placing the first material 5 in the sealed space 4 containing the element section 2 and thereby preventing the perovskite compound from being decomposed during the operation or storage of the solar cell module for a long time.

Example 3 and Comparative Example 3

Solar cell modules of Example 3 and Comparative Example 3 in which the sealed space 4 of each of the solar cell modules of Example 2 and Comparative Example 2 was filled with a silicone resin were produced, and the relationship between the operation time and the output characteristics in each solar cell module was investigated. The solar cell modules of Example 3 and Comparative Example 3 differ from the solar cell modules of Example 2 and Comparative Example 2, respectively, in that the sealed space 4 was filled with a silicone resin. The other structures of the solar cell modules of Example 3 and Comparative Example 3 are the same as those of the solar cell modules of Example 2 and Comparative Example 2, and the description thereof is omitted.

Example 3

A method of producing the solar cell module of Example 3 will now be described. The procedure until the process of forming a solar cell element by bonding power lines 6 of aluminum to ends of the element section 2 with silver paste is the same as that in Example 2, and the description thereof is omitted.

A low-temperature crosslinking silicone resin (manufactured by Shin-Etsu Silicone) sheet of 18 cm length, 18 cm width, and 0.5 mm thickness was placed on the center of a glass substrate as a plate member being the first portion 31 of a sealer 3.

Further, 100 mg of a powder of methyl ammonium hydroiodide $CH_3NH_3I$ as a first material 5 was spread on the low-temperature crosslinking silicone resin sheet, and a solar cell element was placed on the low-temperature crosslinking silicone resin sheet such that the element section 2 and the low-temperature crosslinking silicone resin sheet were in contact with each other.

The plate member, the low-temperature crosslinking silicone resin sheet, and the solar cell element were heated in vacuum at 60° C. for 10 minutes with a vacuum laminator (LM30×30, manufactured by NPC Incorporated) and were thereby fixed through crosslinking of the low-temperature silicone resin.

Subsequently, hot-melt butyl rubber as a seal member being the second portion 32 of the sealer 3 was poured between the substrate 1 and the plate member so as to surround the element section 2. The seal member was disposed so as to join the periphery of the substrate 1 and the periphery of the plate member. The seal member had a width of 5 mm. A sealed space 4 hermetically sealed with the substrate 1, the plate member, and the seal member was thus formed. The power lines 6 were extracted from the inside of the sealed space 4 to the outside by piercing through the seal member. The solar cell module of Example 3 was thus produced.

Comparative Example 3

A solar cell module of Comparative Example 3 was produced as in Example 3 except that 100 mg of a powder of methyl ammonium hydroiodide $CH_3NH_3I$ as a first material 5 was not spread on the low-temperature crosslinking silicone resin sheet. The components other than the first material 5 were the same as those in Example 3.

Evaluation of Photoelectric Conversion Characteristics

One each of the solar cell modules of Example 3 and Comparative Example 3 were produced, and the photoelectric conversion characteristics of the modules were evaluated. Herein, the solar cell modules were placed in the atmosphere at room temperature for 26 days, and changes in output of the solar cell modules were measured under the conditions of pseudo sunlight irradiation with a light intensity of 1 $kW/m^2$.

Figure 7:
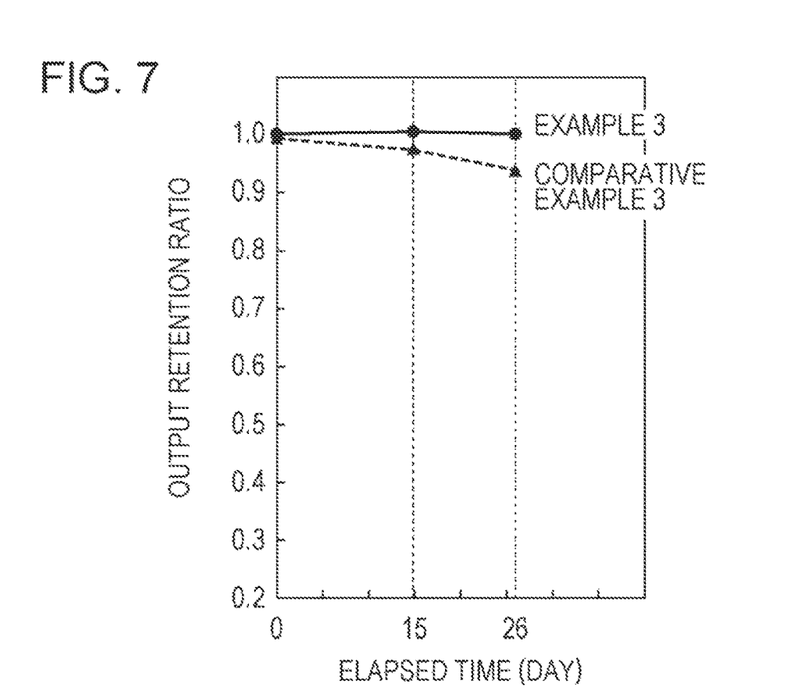
FIG. 7 is a graph showing the output retention ratios of the solar cell modules of Example 3 and Comparative Example 3.

FIG. 7 is a graph showing the output retention ratios of the solar cell modules of Example 3 and Comparative Example 3.

As obvious from the results shown in FIG. 7, in the solar cell module of Comparative Example 3 in which the first material 5 was not disposed in the sealed space 4, the output after 26 days elapse decreased to about 94%. In contrast to this, in the solar cell modules of Example 3 in which the first material 5 was disposed in the sealed space 4, a reduction in output was hardly observed even after 26 days elapse. It is inferred that the results were obtained by placing the first material 5 in the sealed space 4 containing the element section 2 and thereby preventing the perovskite compound from being decomposed during the operation or storage of the solar cell module for a long time.

What is claimed is:

1. A solar cell module comprising:
a substrate;
an element section disposed on the substrate and including a unit cell;
a sealer; and
a first material, wherein:
the element section and the first material are housed in a space sealed with the sealer;
the unit cell includes a first electrode, a second electrode and a light-absorbing layer, the light-absorbing layer being located between the first electrode and the second electrode and converting light into electric charge;
the light-absorbing layer includes a perovskite compound represented by a compositional formula AMX3, where A represents a monovalent cation, M represents a divalent cation, and X represents a monovalent anion;
the first material is an amine derivative represented by a compositional formula $(Q_1Q_2Q_3\text{-N---H})Y$, where $Q_1$, $Q_2$, and $Q_3$ each independently represent a functional group including at least one element selected from the group consisting of carbon, hydrogen, nitrogen, and oxygen; and Y represents a halogen;
the substrate, the first electrode, the light-absorbing layer and the second electrode are provided in this order; and
the first material is in direct contact with an inner surface of the sealer, or a surface of the second electrode such that the second electrode is between the light-absorbing layer and the first material.

2. The solar cell module according to claim 1, wherein at least one selected from the group consisting of the $Q_1$, $Q_2$, and $Q_3$ includes one to four carbon atoms.

3. The solar cell module according to claim 1, wherein the sealer includes:
a first portion facing the substrate with a gap between the substrate and the first portion; and
a second portion disposed between the substrate and the first portion and surrounding the space.

4. The solar cell module according to claim 3, wherein: the first portion is made of glass; and
the second portion is made of a resin.

5. The solar cell module according to claim 1, wherein the substrate is housed in the space.

6. The solar cell module according to claim 1, further comprising: a filler housed in the space.

7. The solar cell module according to claim 6, wherein the first material is located inside the filler.

8. The solar cell module according to claim 1, wherein the first material includes a compound represented by a compositional formula AX, where A represents a monovalent cation, and X represents a monovalent anion.

9. The solar cell module according to claim 1, wherein:
a plurality of unit cells are included in the element section, each of the plurality of unit cells being the unit cell, and
each of the plurality of unit cells includes the first electrode, the second electrode and the light-absorbing layer.

10. A solar cell module comprising:
a substrate;
an element section disposed on the substrate and including a unit cell;
a sealer; and
a first material, wherein:
the element section and the first material are housed in a space sealed with the sealer;
the unit cell includes a pair of electrodes having conductivity and includes a light-absorbing layer, the light-absorbing layer being located between the pair of electrodes and converting light into electric charge;
the light-absorbing layer includes a perovskite compound represented by a compositional formula $AMX_3$, where A represents a monovalent cation, M represents a divalent cation, and X represents a monovalent anion;
the first material is an amine derivative having a structure that inhibits decomposition of the perovskite compound, the first material being represented by a compositional formula $(Q_1Q_2Q_3\text{-N---H})Y$, where $Q_1$, $Q_2$, and $Q_3$ each independently represent a functional group including at least one element selected from the group consisting of carbon, hydrogen, nitrogen, and oxygen; and Y represents a halogen; and the first material is spaced apart from the light-absorbing layer.

* * * * *